United States Patent [19]

Saitoh et al.

[11] Patent Number: 5,677,236
[45] Date of Patent: Oct. 14, 1997

[54] PROCESS FOR FORMING A THIN MICROCRYSTALLINE SILICON SEMICONDUCTOR FILM

[75] Inventors: Kimihiko Saitoh; Nobuyuki Ishiguro; Mitsuru Sadamoto; Shin Fukuda; Yoshinori Ashida; Nobuhiro Fukuda, all of Kanagawa-ken, Japan

[73] Assignee: Mitsui Toatsu Chemicals, Inc., Tokyo, Japan

[21] Appl. No.: 605,609

[22] Filed: Feb. 22, 1996

[30] Foreign Application Priority Data

| Feb. 24, 1995 | [JP] | Japan | 7-037138 |
| Aug. 15, 1995 | [JP] | Japan | 7-207957 |
| Aug. 24, 1995 | [JP] | Japan | 7-216088 |
| Oct. 17, 1995 | [JP] | Japan | 7-268807 |
| Dec. 22, 1995 | [JP] | Japan | 7-334855 |

[51] Int. Cl.$^6$ .................................. H01L 31/20
[52] U.S. Cl. .................. 437/109; 136/249; 136/258; 257/53; 257/64; 257/440; 257/458; 427/578; 437/4; 437/99; 437/101; 437/113; 437/233
[58] Field of Search ............ 136/249 TJ, 258 PC, 136/258 AM; 257/53, 64, 440, 458; 252/501.1, 62.3 R, 62.3 E; 148/33, 33.2; 427/74, 578; 437/4, 99, 101, 109, 113, 233

[56] References Cited

U.S. PATENT DOCUMENTS

| 4,433,202 | 2/1984 | Maruyama et al. | 136/255 |
| 5,017,308 | 5/1991 | Iijima et al. | 252/501.1 |
| 5,103,284 | 4/1992 | Ovshinsky et al. | 257/64 |
| 5,478,777 | 12/1995 | Yamazaki | 437/173 |

FOREIGN PATENT DOCUMENTS

| 0592227 | 4/1994 | European Pat. Off. . |
| 63-274184 | 11/1988 | Japan . |
| 3-66177 | 3/1991 | Japan . |
| WO93/17449 | 9/1993 | WIPO . |

OTHER PUBLICATIONS

J. Meiser et al, "Complete Microcrystalline p–i–n Solar Cell–Crystalline or Amorphous Cell Behavior", *Appl. Phys. Lett.* 65 (7), 1994, pp. 860–862.

F. Flückiger et al, "Preparation of Undoped and Doped Microcrystalline Silicon (μc–/su:H) by VHF–GD for P–I–N Solar Cells", *Proc. 23rd IEEE PVSC*, vol. 2, 1993, pp. 839–844.

Shen et al, "Thin Boron Doped Microcrystalline Silicon Films", *Solar Energy and Solar Cells*, vol. 30, No. 2, XP000381983, pp. 139–145, 1993.

J. Meier et al, "Intrinsic Microcrystalline Silicon (μc–Si:H)–A Promising New Thin Film Solar Cell Material", *Proceedings of the 1994 IEEE 1st World Conference on Photovoltaic Energy Conversion*, vol. 1, pp. 409–412, 1994.

*Primary Examiner*—Aaron Weisstuch
*Attorney, Agent, or Firm*—Burns, Doane, Swecker & Mathis

[57] ABSTRACT

A thin microcrystalline silicon semiconductor film suitable for use as an intrinsic semiconductor layer in an amorphous silicon solar cell or the like. The thin microcrystalline silicon semiconductor film comprises an amorphous phase with crystallites contained therein in the form of a prismatic or conical crystallite aggregate phase. Additional crystallites may be dispersed as individual crystallites in the amorphous phase. In the thin film, the crystalline fraction may preferably range from 5 to 80% and the crystallite size may preferably range from 2 to 1,000 nm. This thin film can be formed by first forming an initial film to a thickness in a range of from 2 nm to 100 nm at a deposition rate of from 0.01 nm/sec to 0.1 nm/sec on a substrate and then forming a principal film at a deposition rate of from 0.1 nm/sec to 2 nm/sec, for example, in accordance with RF plasma CVD.

7 Claims, 2 Drawing Sheets

PROCESS FOR FORMING A THIN MICROCRYSTALLINE SILICON SEMICONDUCTOR FILM

BACKGROUND OF THE INVENTION

1. Field of the Invention

This invention relates to a silicon photovoltaic device such as a solar cell, especially to a p-i-n photovoltaic device and also to a thin microcrystalline silicon semiconductor film suitable for use in the photovoltaic device.

2. Description of the Related Art

Silicon solar cells have already found commercial utility as small-output energy sources for driving electronic calculators and watches. As large-output energy sources for use in supplying power, however, no solar cells have advanced yet to any satisfactory level in performance. A variety of studies are now under way with a view to making improvements in the performance of silicon solar cells.

Solar cells making use of amorphous silicon are receiving increasing attention for their excellent mass producibility and their possibility of a reduction in manufacturing cost. In general, the photovoltaic efficiency η of a solar cell is expressed by dividing the product of open-circuit voltage $V_{oc}$, short-circuit current $I_{sc}$ and fill factor FF with incident light energy $P_{in}$. As a result of various studies, an amorphous silicon solar cell has been found, with respect to the short-circuit current and the fill factor, to give results close to theoretically estimated values predictable from physical properties of the amorphous semiconductor, for example, 19 mA/cm$^2$ as the short-circuit current and 0.78 as the fill factor. In regard to the open-circuit voltage, a value has also been obtained which is close to a voltage predicted when physical properties of materials of individual layers making up a photovoltaic device are taken into consideration.

However, these solar cells which make use of amorphous silicon involve the problem that the photovoltaic efficiency is deteriorated by exposure to light. In particular, the degree of this deterioration becomes greater with the short-circuit current. In order to proceed with developments of amorphous photovoltaic devices of high photovoltaic efficiency and high reliability intended for use in power applications, it is recognized to be a principal theme from such current situations and theoretical consideration to reduce defects, which internally exist in individual layers making up a photovoltaic device, to such an extent as those found in crystalline materials. Under the circumstances, however, no technique appears to be available for reducing defects still further in amorphous materials.

With a view to improving the photovoltaic efficiency η in solar cells, there have been developed p-i-n photovoltaic devices of the construction wherein a single intrinsic semiconductor layer having a narrow band gap is placed between a p-type semiconductor layer and an n-type semiconductor layer, as well as tandem photovoltaic devices in which plural p-i-n elements are monolithically and continuously formed in a stacked form and the intrinsic semiconductor layers in the individual p-i-n elements have different band gaps. Of these, the photovoltaic devices of the stacked tandem structure have been found to permit an improvement in light resistance because the intrinsic semiconductor layers can be formed relatively thin. As photovoltaic devices having high photovoltaic efficiency and high reliability, many research achievements regarding the tandem photovoltaic devices have been reported. In this research, an emphasis was placed on making the band gap of each intrinsic semiconductor layer narrower. To achieve this goal, a film-forming technique was used to control the quantity of hydrogen bound in amorphous silicon. It has also been studied to apply a material to which a hetero-element such as germanium is added, which can be formed in a similar manner as so-called compound semiconductors, to intrinsic semiconductor layers of narrow band gap or to intrinsic semiconductor layers in photovoltaic devices of the stacked tandem structure. Materials formed in such a manner however contain defects at a much greater density. Therefore, photovoltaic devices actually obtained from them have photovoltaic efficiencies much lower than theoretically estimated values and further, have not been improved at all in light stability.

Silicon materials having a narrow effective band gap include a silicon semiconductor having microcrystallinity. Microcrystalline silicon is considered to be a promising candidate in recent years because it is superior in light stability to amorphous silicon. Nevertheless, microcrystalline silicon contains many defects and has a band gap as wide as crystalline silicon, so that photovoltaic devices obtained from the use of microcrystalline silicon are limited only to those having an open-circuit voltage extremely smaller compared with that of those obtained from amorphous silicon and possessing a small photovoltaic efficiency. Considering the defect density, for example, the spin density as measured by ESR (Electron spin Resonance) is higher by about one order of magnitude or so in microcrystalline silicon than in amorphous silicon [Philos. Mag. B, 48, 431(1983)]. Solar cells obtained to date, which are each provided with a single intrinsic semiconductor layer making use of a microcrystalline silicon semiconductor, are therefore limited only to those having a photovoltaic efficiency η as low as about 1 to 2%.

Recently, a research group at Neuchatel University, Switzerland, reported success in improving to about 4.6% the photovoltaic efficiency of a solar cell making use of microcrystalline silicon in an intrinsic semiconductor layer by using a special CVD process called "VHF plasma CVD" [Appl. Phys. Lett., 65(7), 860(1994)]. However, an open-circuit voltage as low as about 0.39 V was obtained with that solar cell. Open-circuit voltage was then improved to 0.60 to 0.78 V or so by the application of a p-type amorphous silicon carbide layer or by the provision of an interfacial layer at an interface between a p-type semiconductor layer and an intrinsic semiconductor layer, but due to a substantial drop in fill factor, the photovoltaic efficiency was reduced [Proc. 23rd IEEE PVSC, 2, 839(1993)]. With a photovoltaic device of the stacked tandem structure in which a microcrystalline silicon semiconductor was used in an intrinsic layer on a non-light impinging side, it was therefore only possible to obtain an initial photovoltaic efficiency of 9.1% at an open-circuit voltage of 1.13 V [Proc. IEEE 1st VCPEC, 1, 409(1994)]. Although VHF plasma CVD is used for formation of each intrinsic semiconductor layer in these solar cells, the deposition rate of the microcrystalline silicon film is as low as 0.09 nm/sec because of a high dilution of a feed gas with hydrogen. Further, use of RF plasma CVD generally leads to a further reduction in deposition rate to 0.01 to 0.05 nm/sec, resulting in a significant disadvantage in productivity.

SUMMARY OF THE INVENTION

An object of the present invention is to increase the photovoltaic efficiency of a photovoltaic device such as a silicon solar cell so that its reliability can be improved.

Another object of the present invention is to provide a microcrystalline silicon film suitable for use as a substantially intrinsic semiconductor film layer in a p-i-n photovoltaic device or a tandem photovoltaic device and further to provide a photovoltaic device improved in open-circuit voltage and deposition rate without substantial reductions in short-circuit current and fill factor and also increased in photovoltaic efficiency, light stability, and productivity by using the above microcrystalline silicon semiconductor film.

The present invention which can attain the above-described objects is specified by technical features to be described hereinafter.

A thin microcrystalline silicon semiconductor film according to the present invention comprises an amorphous phase with a crystalline phase composed of crystallites aggregated in a prismatic or conical form.

A thin microcrystalline silicon semiconductor film according to the present invention comprises an amorphous phase with crystallites contained therein. A portion of the crystallites is dispersed as individual crystallites and the remaining portion of the crystallites is in the form of a prismatic or conical crystallite aggregate phase.

A photovoltaic device according to the present invention comprises a thin p-type semiconductor film, a thin substantially intrinsic semiconductor film, and a thin n-type semiconductor film stacked one over another. The thin substantially intrinsic semiconductor film is the above-described thin microcrystalline silicon semiconductor film of the present invention.

A stacked-structure tandem photovoltaic device according to the present invention comprises a first stacked p-i-n semiconductor structure and a second stacked p-i-n semiconductor structure stacked together in series. The first stacked p-i-n semiconductor structure is composed of a first thin p-type semiconductor film, a first thin substantially intrinsic semiconductor film, and a first thin n-type semiconductor film, and the second stacked p-i-n semiconductor structure is composed of a second thin p-type semiconductor film, a second thin substantially intrinsic semiconductor film, and a second thin n-type semiconductor film. The first thin substantially intrinsic semiconductor film is a thin amorphous microcrystalline silicon semiconductor film. The second thin substantially intrinsic semiconductor film is the above-described thin microcrystalline silicon semiconductor film of the present invention. The first stacked p-i-n semiconductor structure is arranged on a light-impinging side.

A process according to the present invention comprises forming a thin microcrystalline silicon semiconductor film on a substrate by RF plasma CVD while using as a raw material at least a compound having silicon in the molecule thereof. The process comprises forming first an initial film of the thin microcrystalline silicon semiconductor film to a thickness in a range of from 2 nm to 100 nm on the substrate and then forming a principal film of the thin microcrystalline silicon semiconductor film. The deposition rate of the initial film is in a range of from 0.01 nm/sec to 0.1 nm/sec and the deposition rate of the principal film is greater than the deposition rate of the initial film and is in a range of from 0.1 nm/sec to 2 nm/sec.

DESCRIPTION OF THE PREFERRED EMBODIMENTS

Figure 1:
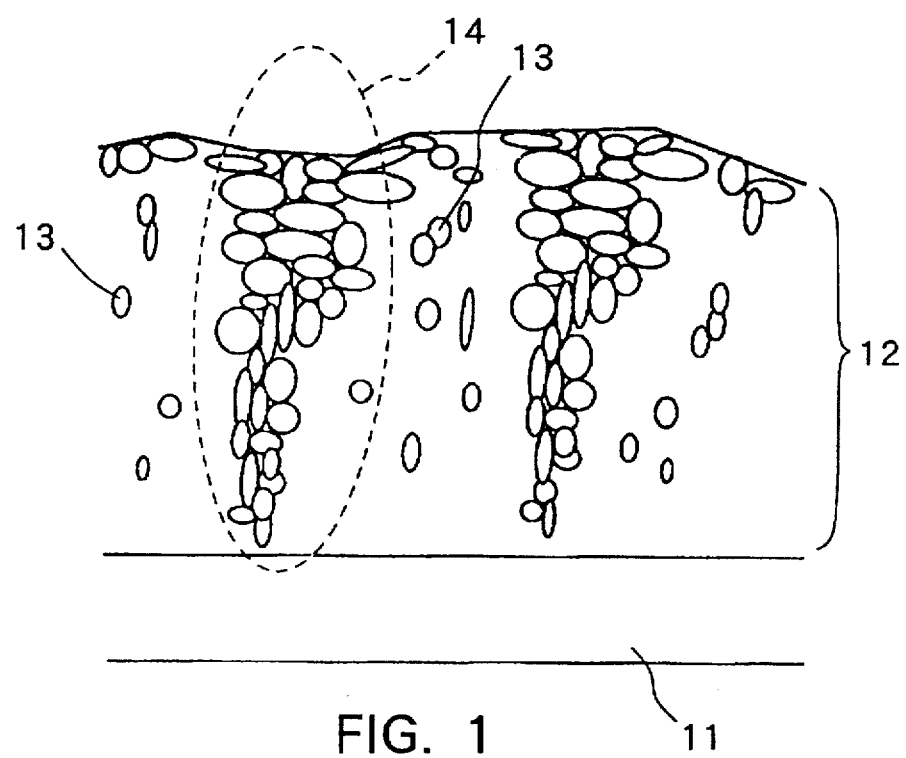
FIG. 1 is a schematic cross-sectional view showing the construction of a thin microcrystalline silicon semiconductor film according to a preferred embodiment of the present invention.

With a view to applying to photovoltaic devices a material having a narrower band gap than conventional amorphous semiconductors, studies have been conducted to use microcrystalline silicon in a photovoltaic device having a single intrinsic semiconductor layer or in each intrinsic semiconductor layer of a photovoltaic device of a stacked tandem structure. However, conventional microcrystalline silicon contains many defects when formed into a film, and has a band gap approximately as wide as crystalline silicon. Conventional solar cells making use of one or more microcrystalline silicon layers are therefore extremely small or low in fill factor and open-circuit voltage compared with those making use of amorphous silicon, resulting in the provision of only those having a low photovoltaic efficiency. If RF plasma CVD, for example, is employed for deposition of such a microcrystalline silicon layer, deposition of a film of material having a high crystalline fraction such as close to 100% requires a high hydrogen dilution. The deposition rate is therefore lowered to 0.01 to 0.05 nm/sec, resulting in a serious disadvantage in productivity.

The present inventors have hence proceeded with an extensive investigation. As a result, it has been found that characteristics of a solar cell making use of microcrystalline silicon semiconductor as an intrinsic layer, especially its open-circuit voltage and photo-deterioration characteristics are heavily dependent on the distribution and structure of crystallites in a thin microcrystalline silicon semiconductor film as the substantially intrinsic semiconductor layer. It has also been found that as a condition for the formation of the microcrystalline silicon film, it can be formed at a deposition rate of 0.1 nm/sec or higher, leading to the finding that an improvement can be expected in productivity over the conventional technique making use of RF plasma CVD.

Described specifically, it has been found that provision of a solar cell having an increased open-circuit voltage requires formation of a prismatic or conical phase by aggregation of crystallites, each being of 2 to 1000 nm in size, more preferably 5 to 80 nm, and also inclusion of an amorphous silicon phase in a proportion of at least 20% or so. In other words, it has been found that the crystalline fraction should preferably be in a range of from 5 to 80%. It has also been found that owing to the higher resistance to photo-deterioration of the crystalline phase and the availability of a higher electric field in the intrinsic semiconductor layer because of the increased open-circuit voltage, adoption of the structure of this thin microcrystalline silicon film leads to a reduction in photo-deterioration compared with solar cells making use of conventional amorphous silicon or microcrystalline silicon.

The term "crystallites" as used herein means silicon single crystal grains which are observed in an amorphous phase and can be readily confirmed via a transmission electron micrograph or the like. The thin microcrystalline silicon semiconductor film according to the present invention is characterized in that it comprises an amorphous phase with a crystalline phase composed of crystallites aggregated in a prismatic or conical form. This is a novel structure which has been found for the first time by the present inventors. A description will hereinafter be made of the thin microcrystalline silicon semiconductor film according to the present invention.

Thin Microcrystalline Silicon Semiconductor Film

As is illustrated in FIG. 1, the thin microcrystalline silicon semiconductor film according to the present invention is in the form of a thin amorphous silicon semiconductor film (an amorphous phase) 12 containing crystallites 13. In the amorphous phase 12, the crystallites 13 are contained as crystalline aggregate phases 14 which have been formed by their aggregation into prismatic or conical forms. This thin microcrystalline silicon semiconductor film is formed on a substrate 11. The prismatic or conical crystallite aggregate phases 14 are not absolutely required to have a complete prismatic or conical shape and may take a shape formed by compounding, combining or otherwise mixing a prism and a cone together. In addition to the crystallite aggregate phases 14, the thin microcrystalline silicon semiconductor film according to the present invention may contain additional crystallites 13 dispersed as mutually-independent, individual crystallites in the amorphous phase 12. FIG. 1 also shows the crystallites 13 independently dispersed in the amorphous phase 12. The structures of the amorphous phase 12, crystallites 13, and crystallite aggregate phases 14 as shown in FIG. 1 can be readily confirmed by observation of a transmission electron micrograph or the like.

Here, it is to be noted that in addition to crystallites, an amorphous phase is always contained in a substantial fraction in each thin microcrystalline silicon semiconductor film according to the present invention. In the thin microcrystalline silicon semiconductor film, the crystalline fraction is 80% at most, with 5 to 80% being preferred. It is here that the thin microcrystalline silicon semiconductor film according to the present invention is clearly distinguished from conventionally known microcrystalline films. For example, in the above-described film reported by the research group of Neuchatel University, the crystallization degree is as high as 90 to 100%. This value is far greater than crystallization degrees of thin microcrystalline silicon films according to the present invention. Incidentally, as mentioned above, the size of each crystallite is preferably from 2 to 1,000 nm, more preferably from 5 to 80 nm.

The thin microcrystalline silicon films according to the present invention, especially the prismatic or conical crystallite aggregate phases in the thin microcrystalline silicon film are formed, for example, by plasma CVD, photo-assisted CVD or heat-assisted CVD while using a compound, which contains a silicon atom in its molecule, as a feed gas. It is particularly preferred to conduct continuous formation of films by RF plasma CVD. For this continuous formation, it is preferred to use the feed gas in the form of a mixed gas diluted with hydrogen. When such a mixed gas is employed, the mixed gas should preferably be proportioned to contain the silicon-containing compound in an amount of at least 0.01% by volume.

Upon formation of the above-described thin microcrystalline silicon film on the substrate, it is more preferred to first conduct deposition of a film portion to be formed initially on the substrate, that is, a film portion to a thickness of from 2 to 100 nm from the substrate at a low speed, namely, at a deposition rate of from 0.01 to 0.1 nm/sec, followed by the growth of the remaining film portion at a higher deposition rate of 0.1 to 2 nm/sec. The film formed first on the substrate at the relatively low deposition rate is called the "initially-formed film", whereas the film formed at the relatively high deposition rate subsequent to the formation of the initially-formed film is called the "principal film". The "initially-formed film" is also called the "initial film".

Use of a low deposition rate in the course of initial formation of the microcrystalline silicon film is considered to make it possible to concentrate crystallite-forming energy at a surface and hence to easily form crystalline nuclei which act as seeds for the formation of prismatic or conical crystallite aggregate phases. Even if a high deposition rate of 0.1 nm/sec or greater is set for the subsequent formation of the thin microcrystalline silicon film, that is, the principal film, the existence of such origin nuclei is believed to permit formation of crystallites and prismatic or conical crystallite aggregate phases with ease and good reproducibility. In addition, the present inventors have also found that crystallites growing on these seed nuclei tend to have a greater size than the crystallites as the seed nuclei and aggregation of such large crystallites can provide the resulting crystallite aggregate phases with properties similar to those of crystalline phases. If a crystallite aggregate phase becomes conical by the provision of an origin nucleus by an initially-formed film, the apex of the cone is usually located on a side of the initially-formed film.

As a specific process for the formation of such a thin microcrystalline silicon film, a mixed gas which includes a compound containing silicon in its molecule and, if necessary, hydrogen is prepared preferably in such a way that the concentration by volume of the compound containing silicon falls in a range of from 0.01 to 100%. By RF plasma CVD making use of the mixed gas as a feed gas, a film portion of a thickness of about 2 to 100 nm is formed as an initially-formed film on a substrate at a deposition rate of from 0.01 to 0.1 nm/sec. Over this initially-formed film, a principal film is then formed at a deposition rate of from 0.1 to 2 nm/sec.

When this thin microcrystalline silicon semiconductor film is used as a photovoltaic device, it is effective to form the initially-formed film as a film which contains crystallites of a size in a range of from 20 to 50 nm and has a dark conductivity of from $1\times10^{-11}$ to $1\times10^{-7}$ S/cm, so that the open-circuit voltage can be increased.

The present inventors have found that use of the above-described thin microcrystalline silicon semiconductor film makes it possible to provide a semiconductor device having excellent characteristics, more specifically, a photovoltaic device having an open-circuit voltage close to that available from one making use of amorphous silicon without substantial reductions in short-circuit current and fill factor, having improved light stability, and requiring a substantially-shortened film-forming time.

p-i-n Photovoltaic Device

A description will next be made of the p-i-n photovoltaic device of the present invention which makes use of the thin microcrystalline silicon semiconductor film described above. This photovoltaic device has a construction where on a substrate, a first electrode, a thin semiconductor film of a first conductivity type, a thin substantially intrinsic semiconductor film, a thin semiconductor film of a second conductivity type opposite to the above-described first conductivity type, and a second electrode are stacked one over the other. The thin substantially intrinsic semiconductor film is formed of the above-described thin microcrystalline silicon semiconductor film. In this thin microcrystalline silicon semiconductor film, the proportion of crystallites contained in an amorphous phase, that is, the crystalline fraction is in the range of from 5 to 80% and the crystallites have a size in the range of from 2 to 1,000 nm, more preferably from 5 to 80 nm. The thin microcrystalline silicon semiconductor film contains prismatic or conical phases formed by aggregation of such crystallites.

Most preferred as the photovoltaic device is one having the specific construction wherein a glass sheet with a tin oxide layer formed as a first electrode thereon is used as a substrate, a p-type semiconductor layer, an i-type semiconductor layer consisting of the above-described thin microcrystalline silicon semiconductor film, and an n-type semiconductor layer are successively formed and stacked on the substrate, and silver is used as a second electrode. Incidentally, it is obvious that a translucent electrode is used as the second electrode if a non-translucent substrate or electrode is used as the substrate or the first electrode.

In this p-i-n photovoltaic device, the term "thin substantially intrinsic microcrystalline silicon semiconductor film" means that film forming a photoactive region in a silicon solar cell. Basically, this thin intrinsic microcrystalline silicon semiconductor film can be readily formed from a compound containing silicon in its molecule or a like substance by applying plasma CVD, photo-assisted CVD or heat-assisted CVD. Use of plasma CVD is particularly preferred.

In plasma CVD, a plasma can be produced by applying a d.c. or a.c. voltage across plasma-generating electrodes. The frequency of an alternating current usable for the generation of a plasma may range from 20 Hz to 100 MHz. Especially, 50 Hz and 60 Hz, the commercial power frequencies, and 13.56 MHz, the radio frequency (RF) allocated for ISM (Industrial, Scientific and Medical use), are frequencies preferred for use.

During formation of the thin substantially intrinsic microcrystalline silicon semiconductor film, a compound containing one or more silicon atoms in its molecule is used as a feed gas. Examples of such feed gases include silane compounds represented by the formula $Si_nH_{n+2}$ (n: a positive integer of 1 or greater), and halogenated silane compounds represented by the formula $SiH_nX_{4-n}$ (X: a halogen, i.e., fluorine or chlorine, n: a positive integer of from 1 to 4) or $Si_2H_nX_{6-n}$ (X: a halogen, i.e., fluorine or chlorine, n: a positive integer of from 1 to 6). In particular, feed gases which can be easily used in industry are monosilane ($SiH_4$), disilane ($Si_2H_6$), trisilane ($Si_3H_8$), tetrafluorosilicon ($SiF_4$), difluorosilane ($SiH_2F_2$), trifluorosilane ($SiHF_3$), monofluorosilane ($SiH_3F$), and hexafluorodisilane ($Si_2F_6$).

Formation of a thin substantially intrinsic microcrystalline silicon semiconductor film by CVD making use of an RF plasma will hereinafter be described specifically.

To form this thin substantially intrinsic microcrystalline silicon semiconductor film, an initial film is first formed to a small thickness at a relatively low deposition rate, followed by the formation of a thin microcrystalline film as a principal film at a relatively high deposition rate. The formation of the initial film is carried out by controlling plasma-generating power within a range of from 0.01 mW/cm$^2$ to 100 W/cm$^2$ in terms of power density, diluting the feed gas with hydrogen to make the concentration of the feed gas fall within a range of from 0.01 to 100% by volume and then using the mixed gas so diluted. The concentration of the feed gas ranges preferably from 0.1 to 10%, more preferably from 0.1 to 2%. This feed gas may be diluted further with an inert gas such as argon or helium. As deposition conditions, the substrate temperature is from 50° to 500° C., preferably from 50° to 350° C., notably from 75° to 250° C., while the deposition pressure is from 0.01 to 10 Torr, preferably from 0.03 to 5 Torr, most preferably from 0.035 to 2.0 Torr. Introduction of the feed gas is conducted through a gas flowmeter. The flow rate ranges, for example, from 1 cc/min to 1,000 cc/min as measured under standard conditions (0° C., 1 atm). It is preferred to control the deposition rate of the initial film within a range of from 0.01 to 0.1 nm/sec under these deposition conditions. Further, the thickness of the initial film is from 2 to 100 nm, with 2 to 10 nm being preferred.

On the other hand, in the formation of the principal film of the thin substantially intrinsic microcrystalline silicon semiconductor film after the above-described formation of the initial film, the plasma-generating power is controlled within a range of from 0.01 mW/cm$^2$ to 100 W/cm$^2$ in terms of power density, and a mixed gas obtained by diluting the above-described feed gas with hydrogen to make the concentration of the feed gas fall within a range of from 0.01 to 100% by volume is used as a raw material. The concentration of the feed gas ranges preferably from 0.1 to 20%, more preferably from 0.1 to 5%. This feed gas may be diluted further with an inert gas such as argon or helium. As deposition conditions, the substrate temperature is from 50° to 500° C., preferably from 50° to 350° C., notably from 75° to 250° C., while the deposition pressure is from 0.01 to 10 Torr, preferably from 0.03 to 5 Torr, most preferably from 0.035 to 2.0 Torr. Introduction of the feed gas is conducted through a gas flowmeter. The flow rate ranges, for example, from 1 cc/min to 1,000 cc/min as measured under standard conditions. It is preferred to control the deposition rate of the microcrystalline silicon film within a range of from 0.1 to 2 nm/sec, preferably from 0.1 to 1 nm/sec under these deposition conditions. The thickness of the thin substantially intrinsic semiconductor film formed as described above ranges from 200 nm to 10 μm, including the initial film.

The crystallite size and crystalline fraction of the thin microcrystalline silicon semiconductor film can be determined by Raman scattering spectroscopy, X-ray diffraction, transmission electron microscopy or the like. As simple and convenient methods, the crystalline fraction can be calculated from the intensity of Raman scattering or X-ray diffraction, whereas the crystallite size can be calculated from the peak width at half height in an X-ray diffraction spectrum. For the size determination of extremely small crystallites, a measurement relying upon a transmission electron micrograph is useful. Here, the crystalline fraction measured using the transmission electron micrograph is defined as an area ratio of crystalline regions to amorphous regions in the micrograph, and the crystallite size is defined as the greatest one of diagonals or diameters in individual regions of a polygonal or elongated circular shape observed as crystallites. Measurements by such a transmission electron micrograph are very useful for the determination of the distribution and structure of crystallites.

Preferably usable examples of the thin p-type semiconductor film employed in the photovoltaic device include a thin film of p-type amorphous silicon, amorphous silicon carbide, microcrystalline silicon, microcrystalline silicon carbide or carbon-containing microcrystalline silicon, a multilayer film of amorphous silicon carbides having different carbon contents, and a multilayer film of amorphous silicon and amorphous carbon. A thin film of p-type microcrystalline silicon, microcrystalline silicon carbide or carbon-containing microcrystalline silicon is more preferred.

As a process for the formation of the p-type semiconductor layer, plasma CVD or photo-assisted CVD is used. As a raw material for such a process, silane, disilane or trisilane is employed as a silicon compound. Further, as a dopant for imparting p-type conductivity, diborane, trimethylboron, trifluoroboron or the like is preferred. Moreover, as a carbon-containing compound, a saturated hydrocarbon such as methane or ethane, an unsaturated hydrocarbon such as ethylene or acetylene, or an alkylsilane such as monomethylsilane or dimethylsilane is used. Such a mixed gas may be diluted with an inert gas such as helium or argon or with hydrogen as needed without departing from the scope of the present invention. To the contrary, upon formation of a thin microcrystalline silicon film, it is more preferred to dilute the mixed gas with a large volume of hydrogen.

As conditions for the formation of the p-type semiconductor layer, the film thickness ranges from 2 to 50 nm, with 5 to 20 nm being particularly preferred, the deposition temperature ranges from 50° to 400° C., preferably from 50° to 250° C., and the forming pressure ranges from 0.01 to 5 Torr, preferably from 0.03 to 1.5 Torr, notably from 0.035 to 1.0 Torr. Upon formation by RF plasma CVD, the RF power should be controlled within a range of from 0.01 mW/cm$^2$ to 10 W/cm$^2$. Especially, when the p-type semiconductor layer is formed with a thin microcrystalline silicon film, it is preferred to conduct the formation with RF power in a range of from 0.5 to 10 W/cm$^2$.

As the thin n-type semiconductor film employed in the photovoltaic device, a thin n-type microcrystalline film or a thin n-type amorphous film can be used effectively. Effectively usable examples of such thin films include a thin n-type microcrystalline silicon film, a thin carbon-containing microcrystalline silicon film, a thin microcrystalline silicon carbide film, a thin amorphous silicon film, a thin amorphous silicon carbide film, and a thin amorphous silicon germanium film. These thin n-type semiconductor films can be easily formed by mixing a compound containing a Group V element of the Periodic Table, such as phosphine or arsine, and hydrogen with a raw material chosen as needed depending on the target thin semiconductor film, from compounds containing silicon in their molecules, compounds containing germanium in their molecules, such as germane and silylgermane, hydrocarbon gases and the like, and applying plasma CVD or photo-assisted CVD. Further, dilution of the feed gas with an inert gas such as helium or argon by no means impairs the effects of the present invention. To the contrary, upon formation of a thin microcrystalline silicon film, it is more preferred to dilute the mixed gas with a large volume of hydrogen. As forming conditions, the depositing temperature ranges from 50° to 400° C., preferably from 100° to 350° C., and the forming pressure ranges from 0.01 to 5 Torr, preferably from 0.03 to 1.5 Torr. Upon formation by plasma CVD, the RF power should be controlled within a range of from 0.01 to 10 W/cm$^2$. Especially, when the n-type semiconductor layer is formed with a thin microcrystalline silicon film, it is preferred to control the RF power within a range of from 0.1 to 10 W/cm$^2$. A thickness of from 10 to 50 nm is sufficient for the thin n-type semiconductor film.

Compounds preferred for use in the above-described feed gas will now be described based on more specific examples. Effectively usable examples of the compound containing silicon in its molecule include silicon hydrides such as monosilane, disilane and trisilane; alkyl-substituted silicon hydrides such as monomethylsilane, dimethylsilane, trimethylsilane, tetramethylsilane, ethylsilane and diethylsilane; silicon hydrides containing one or more radically-polymerizable, unsaturated hydrocarbon groups such as vinylsilane, divinylsilane, trivinylsilane, vinyldisilane, divinyldisilane, propenylsilane and ethenylsilane; and fluorinated silicons obtained by either partly or wholly substituting the hydrogen atoms of these silicon hydrides with fluorine atoms.

Useful specific examples of the hydrocarbon gas include methane, ethane, propane, ethylene, propylene and acetylene. These hydrocarbon gases can be conveniently used when it is desired to modify the optical band gap in the formation of a thin carbon-containing microcrystalline silicon film, a thin microcrystalline silicon carbide film or the like. For this purpose, materials such as alkyl-substituted silicon hydrides, silicon hydrides containing one or more radically-polymerizable, unsaturated hydrocarbon groups in their molecules and fluorinated silicons obtained by either partly or wholly substituting the hydrogen atoms of these silicon hydrides with fluorine atoms are also useful.

No particular limitation is imposed on the substrate of the photovoltaic device, insofar as the substrate has a thickness and surface configuration sufficient to allow a solar-cell, which is to be formed thereon, to retain its shape and is made of a material capable of withstanding the temperatures to which the substrate may be exposed during the formation of the solar cell. Specific usable examples of the substrate include glass sheets such as borosilicate glass, soda-lime glass and quartz glass sheets; ceramic sheets such as alumina, boron nitride and silicon sheets; metal sheets such as aluminum, stainless steel, chromium, titanium and molybdenum sheets, and ceramic sheets coated with these metals; polymer sheets or films such as polyethersulfone (PES), polyetheretherketone (PEEK), polycarbonate (PC), polyethylene terephthalate (PET), polyethylene naphthalate (PEN), polyamide, and polyimide plates and sheets; and polymer sheets or films coated with the above-described metals.

The term "electrode" means a translucent electrode or a metal electrode. Although no particular limitation is imposed on the translucency of the electrode, it is necessary to choose a translucent material as a material for either one or both of the electrodes because impinging of sunlight on a photovoltaic layer is needed. Effectively usable examples of the material of the translucent electrode include metal oxides such as tin oxide, indium oxide and zinc oxide; and translucent metals and the like. For the metal electrode, it is possible to use a metal which is chosen as desired from aluminum, chromium, nickel-chromium alloys, silver, gold, platinum and the like.

The semiconductors and materials, at least those which are indispensable for the construction of the photovoltaic device (solar cell), have been described above. It is to be noted that the introduction of the interfacial layer, which acts to improve the performance of the solar cell, at the interface between the p-type semiconductor layer and the i-type semiconductor layer, between the i-type semiconductor layer and the n-type semiconductor layer or between the first electrode and the first p-type semiconductor layer is not essential for the practice of the present invention. As a matter of fact, it is evident that such an interfacial layer can be used as desired depending on the purpose without impairing the objects of the present invention. Incidentally, in the photovoltaic device of the stacked tandem structure to be described subsequently herein, an interfacial layer can be introduced at the interface between the first n-type semiconductor layer and the second p-type semiconductor layer in addition to the above-described individual interfaces.

p/i Interfacial Layer

Further, it is a preferred embodiment to arrange a p/i interfacial layer formed of a thin amorphous silicon carbide film between the thin p-type doped semiconductor film and the thin substantially intrinsic silicon semiconductor film in the above-described p-i-n solar cell which makes use of the thin microcrystalline silicon semiconductor film as an intrinsic semiconductor layer. The thin amorphous silicon carbide film, which is formed as the interfacial layer between the thin p-type doped semiconductor film and the thin substantially intrinsic silicon semiconductor film, can be readily formed from a compound containing one or more silicon atoms in its molecule or a like substance by applying plasma CVD, photo-assisted CVD or heat-assisted CVD. Use of plasma CVD or mercury-sensitized CVD is particularly preferred.

When forming this p/i interfacial layer by plasma CVD, a plasma can be produced by applying a d.c. or a.c. voltage across plasma-generating electrodes. The frequency of an alternating current usable for the generation of a plasma may range from 20 Hz to 100 MHz. Especially, 50 Hz and 60 Hz, the commercial power frequencies, and 13.56 MHz, the ISM frequency are frequencies preferred for use. It is however to be noted that the frequency of this plasma-producing current, including direct current, does not impart any problem to the practice of the present invention. The power for producing a plasma for the formation of the p/i interfacial layer is in a range of from 0.001 mW/cm$^2$ to 100 W/cm$^2$, preferably from 0.01 mW/cm$^2$ to 10 mW/cm$^2$ as expressed in terms of power density.

Illustrative of the raw material employed upon formation of the thin amorphous silicon carbide film include silane, disilane and trisilane as silicon compounds. Further, usable examples of carbon-containing compounds include saturated hydrocarbons such as methane and ethane; unsaturated hydrocarbons such as ethylene and acetylene; and alkylsilanes such as monomethylsilane and dimethylsilane. Dilution of a mixed gas of such raw materials with an inert gas such as helium or argon or with hydrogen as needed does not prevent the practice of the present invention. It is also a preferred embodiment to mix diborane, trimethylboron, trifluoroboron or the like for the provision of p-type conductivity. The preferred concentration of boron in an amorphous silicon carbide film formed by mixing such a boron-containing compound ranges from $10^{15}$ to $10^{18}$ cm$^{-3}$. As forming conditions, the film thickness ranges from 2 to 50 nm, with 5 to 20 nm being particularly preferred, the deposition temperature ranges from 50° to 400° C., preferably from 50° to 250° C., most preferably from 75° to 250° C., and the forming pressure ranges from 0.01 to 5 Torr, preferably from 0.03 to 1.5 Torr, notably from 0.035 to 1.0 Torr.

Photovoltaic Device of Stacked Tandem Structure

According to the present invention, a photovoltaic device of stacked tandem structure can also be fabricated.

As the thin microcrystalline silicon semiconductor film according to the present invention has a band gap narrower than an amorphous silicon film, it is effective and preferred for an improved light absorption rate to use amorphous silicon for the substantially intrinsic semiconductor layer in the element on the light-impinging side and to apply the thin microcrystalline silicon film according to the present invention for the substantially intrinsic semiconductor layer in the element on the non-light impinging side upon stacking the two p-i-n photovoltaic elements together.

Described specifically, in a photovoltaic device of the stacked tandem structure obtained by stacking a p-i-n semiconductor structure A—in which a thin amorphous silicon semiconductor film is contained as a thin substantially intrinsic semiconductor film layer—with a p-i-n semiconductor structure B—in which the above-mentioned thin microcrystalline silicon semiconductor film is contained as a thin substantially intrinsic semiconductor film layer—in series to have a cell sequence of AB, the stacked p-i-n semiconductor structure A is arranged to assume a position on the light-impinging side. Further, the use of the thin microcrystalline silicon semiconductor film as the thin n-type doped semiconductor film which exists between the two thin substantially intrinsic semiconductor film layers in the above photovoltaic device of the stacked tandem structure is effective and preferred for the provision of an improved fill factor. For photovoltaic devices of such a stacked tandem structure, it is most common to have a structure as shown in FIG. 2, wherein a glass sheet equipped with a translucent conductive film thereon such as tin oxide, zinc oxide or the like is used as a substrate; a p-type semiconductor layer, an i-type amorphous silicon semiconductor layer, an n-type microcrystalline silicon semiconductor layer, another p-type semiconductor layer, an i-type microcrystalline silicon semiconductor layer and an n-type semiconductor layer are formed and stacked on the substrate in the order presented; and silver is used as a second electrode.

Figure 2:
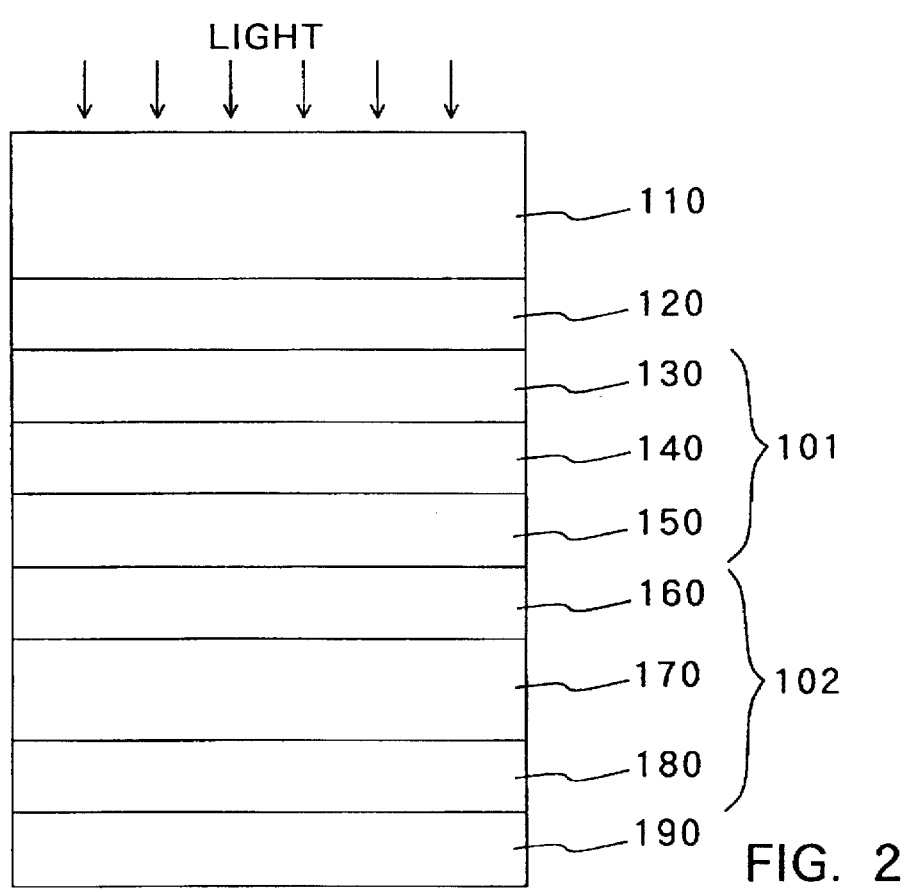
FIG. 2 is a schematic cross-sectional view illustrating the construction of a stacked tandem photovoltaic device according to a preferred embodiment of the present invention.

The photovoltaic device of the stacked tandem structure shown in FIG. 2 has a structure wherein on a glass sheet 110 as a substrate, a translucent conductive film 120, a p-type semiconductor layer 130, an i-type amorphous silicon semiconductor layer 140, an n-type microcrystalline silicon semiconductor layer 150, a p-type semiconductor layer 160, an i-type microcrystalline silicon semiconductor layer 170, an n-type semiconductor layer 180 and a silver electrode 190 are successively stacked one over the other. Namely, this tandem photovoltaic device has been obtained by monolithically stacking two layers of p-i-n photovoltaic elements 101, 102 one over the other. Here, the first p-i-n photovoltaic element 101 is composed of the p-type semiconductor layer 130, the i-type amorphous silicon semiconductor layer 140 and the n-type microcrystalline silicon semiconductor layer 150, whereas the second p-i-n photovoltaic element 102 is composed of the p-type semiconductor layer 160, the i-type microcrystalline silicon semiconductor layer 170 and the n-type semiconductor layer 180. Light impinges the photovoltaic elements 101, 102 from the side of the glass substrate 110.

Figure 3:
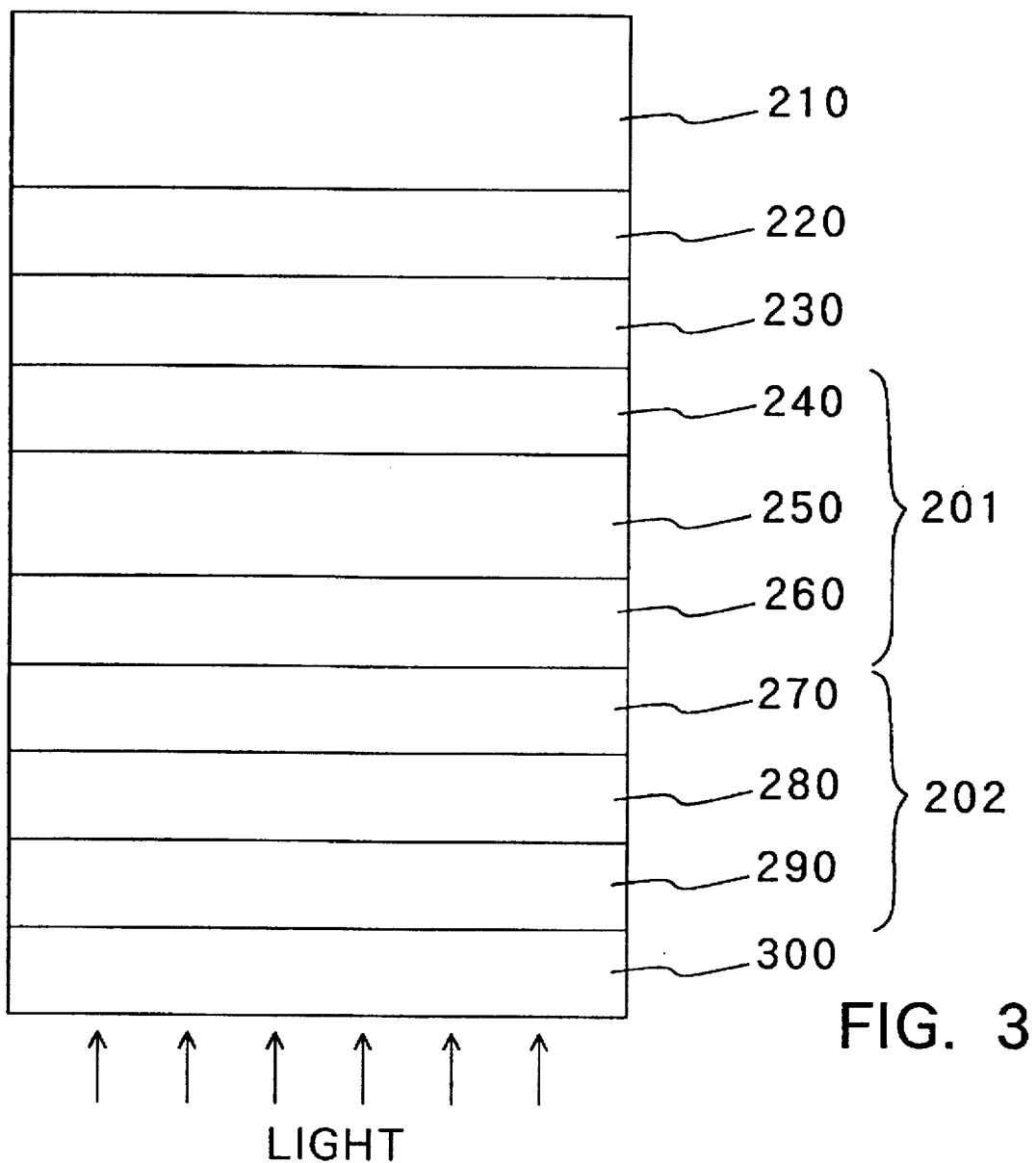
FIG. 3 is a schematic cross-sectional view depicting the construction of a stacked tandem photovoltaic device according to another preferred embodiment of the present invention.

When a substrate or first electrode having no translucency is used, a photovoltaic device of the stacked tandem structure is formed into such a construction wherein as is illustrated in FIG. 3, a translucent electrode is used as a second electrode and a thin amorphous silicon semiconductor film is arranged as a substantially intrinsic semiconductor layer on a light-impinging side. The photovoltaic device of the stacked tandem structure shown in FIG. 3 has been constructed by successively stacking, on a metal substrate 210, a reflective layer 220, a translucent conductive film 230, an n-type semiconductor layer 240, an i-type microcrystalline silicon semiconductor layer 250, a p-type silicon semiconductor layer 260, an n-type microcrystalline silicon semiconductor layer 270, an i-type amorphous silicon semiconductor layer 280, a p-type semiconductor layer 290 and a translucent conductive film 300. This tandem photovoltaic device has been obtained by monolithically stacking two layers of p-i-n photovoltaic elements 201, 202 one over the other. Here, the first p-i-n photovoltaic element 201 is constructed of the n-type semiconductor layer 240, the i-type microcrystalline silicon semiconductor layer 250 and the p-type silicon semiconductor layer 260, while the second p-i-n photovoltaic element 202 is constructed of the n-type microcrystalline silicon semiconductor layer 270, the i-type amorphous silicon semiconductor layer 280 and the p-type semiconductor layer 290. Light impinges from the side of the translucent conductive film 300 shown on the lower side in the drawing.

In each of the above-described photovoltaic devices of the stacked tandem structure, a thin carbon-containing microcrystalline silicon film, a thin microcrystalline silicon carbide film or the like may be used instead of the thin n-type microcrystalline silicon semiconductor film as a thin film having crystallinity, that is, as the n-type semiconductor layer employed between the two thin substantially intrinsic semiconductor layers. Effectively usable examples of the thin n-type amorphous silicon semiconductor film include a thin amorphous silicon film, a thin amorphous silicon carbide film, and a thin amorphous silicon germanium film. These thin n-type semiconductor films can be easily formed by mixing a compound containing a Group V element of the Periodic Table, such as phosphine or arsine, and hydrogen with a raw material chosen as needed depending on the target thin semiconductor film from compounds containing silicon in their molecules, compounds containing germanium in their molecules, such as germane and silylgermane, hydrocarbon gases and the like, and applying plasma CVD or photo-assisted CVD. Further, dilution of the feed gas with an inert gas such as helium or argon by no means impairs the effects of the present invention. To the contrary, upon formation of a thin microcrystalline silicon film, it is more preferred to dilute the mixed gas with a large volume of hydrogen. As forming conditions, the depositing temperature ranges from 50° to 400° C., preferably from 100° to 350° C., and the forming pressure ranges from 0.01 to 5 Torr, preferably from 0.03 to 1.5 Torr. Upon formation by plasma CVD, the RF power should be controlled within a range of from 0.1 to 10 W/cm². A thickness of from 10 to 50 nm is sufficient for the thin n-type semiconductor film. Existence or non-existence of crystallinity in the film so formed can be easily confirmed by an X-ray diffraction spectrum, a Raman scattering spectrum, a transmission electron micrograph or the like.

In each of the above-described photovoltaic devices of the stacked tandem structure, the thin p-type semiconductor film, the thin n-type semiconductor film positioned on the outer side of the two thin substantially intrinsic semiconductor films, the thin substantially intrinsic microcrystalline silicon semiconductor film, the electrodes and the substrate can be formed similarly as in the above-described p-i-n photovoltaic device.

Further, out of the two thin substantially intrinsic silicon semiconductor films, the film located on the light-impinging side forms one of the photoactive regions of the silicon solar cell and as mentioned above, is made of amorphous silicon. In addition to amorphous silicon, one or more hetero-elements effective for controlling the band gap of the thin film, led by hydrogen and fluorine and including germanium, tin, carbon, nitrogen, oxygen and the like can also be contained. A description will now be made of the thin substantially intrinsic semiconductor film located on the light-impinging side.

The thin substantially intrinsic semiconductor film located on the light-impinging side can be readily formed from a compound containing silicon in its molecule or a like substance by applying plasma CVD, photo-assisted CVD or heat-assisted CVD. When forming using a plasma, production of the plasma can be effected by applying a d.c. or a.c. voltage across plasma-generating electrodes. The frequency of an alternating current may range from 20 Hz to 100 MHz. Especially, 50 Hz and 60 Hz, the commercial power frequencies, and 13.56 MHz, the ISM frequency, are frequencies preferred for use. However, the frequency of this plasma-producing current, including the direct current, should not be limited to those mentioned above. The plasma-producing power should be in a range of from 0.001 mW/cm² to 100 W/cm² in terms of power density. A description will hereinafter be made of formation of the thin substantially intrinsic semiconductor film located on the light-impinging side by plasma CVD.

Examples of the feed gas include silane compounds represented by the formula $Si_nH_{n+2}$ (n: a positive integer of 1 or greater), and halogenated silane compounds represented by the formula $SiH_nX_{4-n}$ (X: a halogen, i.e., fluorine or chlorine, n: a positive integer of from 1 to 4) or $Si_2H_nX_{6-n}$ (X: a halogen, i.e., fluorine or chlorine, n: a positive integer of from 1 to 6). Illustrative specific feed gases which can be easily used in industry are monosilane ($SiH_4$), disilane ($Si_2H_6$), trisilane ($Si_3H_8$), tetrafluorosilane ($SiF_4$), difluorosilane ($SiH_2F_2$), trifluorosilane ($SiHF_3$), monofluorosilane ($SiH_3F$), and hexafluorosilane ($Si_2F_6$). Such a feed gas may be diluted with an inert gas, such as argon or helium, or with hydrogen gas. When diluted, the concentration of the feed gas ranges from 1 to 100% by volume.

In addition to the above-described gases, it is possible to mix, as a gas containing a hetero-element for the control of the band gap, monogermane, germanium tetrachloride, stannane ($SnH_4$), tin tetrachloride, tin fluoride, a saturated hydrocarbon compound such as methane or ethane, an unsaturated hydrocarbon compound such as ethylene or acetylene, an organosilane compound such as methylsilane, dimethylsilane, disilylsilane or dimethyldisilane, nitrogen, nitrous oxide ($N_2O$), oxygen, carbon dioxide, steam or the like. Introduction of one or more of these gases as a mixed gas with a film-forming raw material, a reactive gas, an inert gas and a carrier gas does not prevent the practice of the present invention. The concentration of a diluted feed gas ranges from 1 to 100% by volume.

Further, the effects of the present invention will not be impaired at all even by combined use of a conventional technique known in the field of formation of thin intrinsic semiconductor films, for example, even when extremely trace amounts of diborane and phosphine are intentionally mixed at the same time with a feed gas to add boron atoms and phosphorus atoms in trace amounts to the resulting thin substantially intrinsic semiconductor film.

Introduction of the feed gas is conducted through a gas flowmeter. The flow rate ranges from 1 cc/min to 1,000 cc/min (as measured under standard conditions). Further, the deposition temperature ranges from 50° to 400° C., preferably, from 50° to 350° C., while the forming pressure ranges from 0.01 to 100 Torr, preferably, from 0.03 to 1.5 Torr.

Besides plasma CVD, photo-assisted CVD or heat-assisted CVD can also be used for the formation of the thin substantially intrinsic semiconductor film which is located on the light-impinging side and is composed of amorphous silicon. No particular limitation is imposed on the film-forming process for practicing the present invention.

This thin substantially intrinsic semiconductor layer may be formed of a first layer, which is relatively thin and functions as a buffer layer, and a second layer which is formed over the first layer and is relatively thick. In this case, the thickness of the first layer ranges from 10 to 200 nm while that of the second layer ranges from 50 nm to 5 μm.

In the above-described photovoltaic device of the stacked tandem structure, it is also a preferred embodiment to arrange an interfacial layer of a thin amorphous silicon carbide film between the thin p-type semiconductor layer and the thin substantially intrinsic microcrystalline silicon semiconductor film in the stacked p-i-n semiconductor structure B on the light-non-impinging side.

Other Applications

Microcrystalline silicon films according to the present invention are also useful for increasing the performance of silicon semiconductor devices such as TFTs (Thin Film Transistors) and image sensors. As crystalline silicon can be formed at a low substrate temperature, especially, in TFTs, microcrystalline silicon films according to the present invention are very useful in providing active matrix liquid crystal displays, in which TFTs are used, with a higher aperture rate.

EXAMPLES

Illustrative examples of the embodiments of the present invention will hereinafter be described by the following examples.

Example 1

As a fabrication system for a silicon solar cell, a film deposition system permitting application of plasma CVD was used. That film deposition system was constructed of five chambers which consisted of two doped-film deposition chambers for forming thin p-type and n-type semiconductor films, respectively, an i-type layer deposition chamber for forming a thin substantially intrinsic semiconductor layer, a sample loading chamber, and a sample unloading chamber.

First, after placing in the loading chamber a glass substrate equipped with a translucent electrode made of tin oxide, the leading chamber was evacuated to a reduced pressure of $1 \times 10^{-6}$ Torr and the substrate was heated at 160° C. for 30 minutes. The substrate was then transferred to the p-type doped film deposition chamber, where a thin p-type microcrystalline silicon film was deposited. The deposition of the thin p-type microcrystalline silicon film was conducted by charging, as a feed gas, monosilane, diborane, and hydrogen at a ratio of 1/0.003/100 and conducting RF plasma CVD at a pressure of 0.2 Torr, a substrate temperature of 160° C., and an RF power of 0.64 W/cm$^2$. In this example, the frequency employed for producing RF discharge was set at 13.56 MHz. The deposition rate of the thin p-type microcrystalline silicon film was 0.08 nm/sec and the deposition time was set at 250 sec, so that the thin p-type microcrystalline silicon film was formed to a thickness of 20 nm.

The substrate was next transferred to the i-type layer deposition chamber, where a thin microcrystalline silicon film was deposited as an initially-formed film (initial film) of a substantially intrinsic conductivity to a thickness of 10 nm by charging monosilane and hydrogen at a ratio of 2/98 and conducting RF plasma CVD at a pressure of 0.15 Torr, a substrate temperature of 200° C. and an RF power of 0.64 W/cm$^2$. A principal film of the thin microcrystalline silicon film was then formed to a thickness of 1,000 nm by charging monosilane and hydrogen at a ratio of 3/97 and conducting RF plasma CVD at a pressure of 0.15 Torr, a substrate temperature of 200° C., and an RF power of 0.64 W/cm$^2$, whereby the substantially intrinsic semiconductor film was completed.

Subsequent to the formation of the thin i-type semiconductor film, the substrate was transferred to the n-type doped layer depositing chamber. That doped layer depositing chamber was charged with a feed gas, namely, monosilane, phosphine and hydrogen at such flow rates to give a ratio of 0.5/0.06/120. A thin n-type semiconductor film was formed to a thickness of 40 nm by conducting RF plasma CVD at a pressure of 0.2 Torr, a substrate temperature of 160° C., and a frequency 13.56 MHz. At that time, the RF power was 0.8 W/cm$^2$. The substrate was thereafter taken out of the film-depositing system, and a translucent conductive film of indium oxide and tin oxide (ITO) and a silver electrode were successively formed by vacuum evaporation.

Photovoltaic characteristics of the p-i-n silicon solar cell fabricated as described above were measured by irradiating artificial sunlight having an AM (Air Mass) value of 1.5 and an energy density of 100 mW/cm$^2$ from a solar simulator. Here, the AM value of 1.5 means a sunlight spectrum at an average sea level when the sun is located at a zenithal angle $\phi$ (sec $\phi$=1.5). The solar cell had an open-circuit voltage $V_{oc}$ of 0.62 V and therefore, had been extremely improved in open-circuit voltage over the conventional art. Its fill factor FF, short-circuit current $I_{sc}$, and photovoltaic efficiency $\eta$ were 0.55, 14.6 mA/cm$^2$, and 5.0%, respectively. The solar cell therefore showed outstanding initial characteristics.

Further, the solar cell was irradiated at a temperature of 40° C. over 800 hours by light from a halogen lamp having an energy density of 100 mW/cm$^2$. Its photovoltaic characteristics were then measured. As a result, the solar cell was found to have an open-circuit voltage $V_{oc}$ of 0.61 V, a fill factor FF of 0.54, a short-circuit current $I_{sc}$ of 14.0 mA/cm$^2$, a photovoltaic efficiency $\eta$ of 4.6%. Its deterioration rate of photovoltaic efficiency was determined to be 8%. The solar cell was therefore found to have excellent resistance to deterioration.

Based on a transmission electron micrograph of a cut surface of the silicon solar cell, it was also confirmed that the i-type layer was formed of two phases, one being a phase formed of crystallite aggregates grown into prismatic or conical shapes and the other being a phase with individual crystallites dispersed in an amorphous matrix.

An evaluation was conducted of a thin microcrystalline silicon film which was similar to the substantially intrinsic, microcrystalline semiconductor layer in the solar cell. The thin film was formed on a quartz substrate by RF plasma CVD under conditions similar to those employed in the above-described formation of the initial film of the i-type layer of the solar cell, namely, by charging monosilane and hydrogen at a ratio of 2/98 and setting the pressure, substrate temperature and RF power at 0.15 Torr, 200° C., and 0.64 W/cm$^2$, respectively. As a result of the evaluation, the film thickness was found to be 300 nm when film deposition was continuously conducted for 15,000 sec. The deposition rate was therefore 0.02 nm/sec. The reproducibility of the film thickness was ±5% when the film formation has continuously conducted as described above. Accordingly, the accuracy of the deposition rate is also considered to be ±5%. Further, the dark conductivity of the thin film was $1 \times 10^{-7}$ S/cm. Based on a transmission electron micrograph of that sample, the size of the largest crystallite was determined to be 5 nm.

Further, a similar evaluation was conducted on a microcrystalline silicon film (principal film) formed subsequent to the formation of the initial film. The deposition rate, crystallite size, and crystalline fraction were 0.14 nm/sec, 5 to 27 nm, and 70%, respectively.

Examples 2 to 6

In each example, a solar cell was fabricated as in Example 1 except that the conditions for the formation of the initial film of the thin microcrystalline silicon film and those for the subsequent formation of the principal film were changed. Table 1 presents forming conditions for each microcrystalline silicon film making up a substantially intrinsic semiconductor layer. Table 2 shows characteristics of each initial film and its corresponding principal film measured as single films as in Example 1, and Table 3 summarizes characteristics of each solar cell so obtained.

TABLE 1

Overview of Film-Forming Conditions for i-Type Layers of Silicon Solar Cells Obtained in Examples

| Example No. | | Substrate temperature °C. | $SiH_4/H_2$ cc/min | Deposition pressure Torr | RF power $W/cm^2$ | Film thickness nm |
|---|---|---|---|---|---|---|
| 1 | Initial film | 200 | 2/98 | 0.15 | 0.64 | 10 |
|   | Principal film | 200 | 3/97 | 0.15 | 0.64 | 1000 |
| 2 | Initial film | 200 | 2/98 | 0.15 | 0.64 | 100 |
|   | Principal film | 200 | 3/97 | 0.15 | 0.64 | 1000 |
| 3 | Initial film | 200 | 0.1/99.9 | 0.15 | 0.64 | 2 |
|   | Principal film | 200 | 1/99 | 0.15 | 0.64 | 1000 |
| 4 | Initial film | 200 | 0.1/99.9 | 0.15 | 0.64 | 2 |
|   | Principal film | 300 | 0.1/99.9 | 0.15 | 1.28 | 1000 |
| 5 | Initial film | 200 | 0.1/99.9 | 0.15 | 0.64 | 2 |
|   | Principal film | 200 | 20/80 | 0.15 | 0.64 | 1000 |
| 6 | Initial film | 200 | 10/90 | 0.15 | 0.64 | 20 |
|   | Principal film | 200 | 5/95 | 0.15 | 0.64 | 1000 |

TABLE 2

Overview of Single Film Characteristics of Single Microcrystalline Silicon Films Obtained in Examples

| Example No | | Deposition rate nm/sec | Dark conductivity S/cm | Crystallite size nm | Crystalline fraction % |
|---|---|---|---|---|---|
| 1 | Initial film | 0.02 | $1 \times 10^{-7}$ | 5 | Not determined |
|   | Principal film | 0.14 | Not determined | 5–27 | 70 |
| 2 | Initial film | 0.02 | $1 \times 10^{-7}$ | 5 | Not determined |
|   | Principal film | 0.14 | Not determined | 5–27 | 60 |
| 3 | Initial film | 0.01 | $2 \times 10^{-8}$ | 2 | Not determined |
|   | Principal film | 0.10 | Not determined | 10–80 | 80 |
| 4 | Initial film | 0.01 | $2 \times 10^{-8}$ | 2 | Not determined |
|   | Principal film | 0.10 | Not determined | 10–1000 | 80 |
| 5 | Initial film | 0.01 | $2 \times 10^{-8}$ | 2 | Not determined |
|   | Principal film | 2.00 | Not determined | 7–15 | 5 |
| 6 | Initial film | 0.10 | $1 \times 10^{-11}$ | 3 | Not determined |
|   | Principal film | 0.21 | Not determined | 10–25 | 50 |

TABLE 3

Overview of Characteristics of Silicon Solar Cells Obtained in Examples

| Ex. No. | | Open-circuit voltage V | Fill factor | Short-circuit current $mA/cm^3$ | Photovoltaic efficiency % | Deterioration rate of photovoltaic efficiency % |
|---|---|---|---|---|---|---|
| 1 | Initial state | 0.62 | 0.55 | 14.6 | 5.0 | 8 |
|   | After deterioration | 0.61 | 0.54 | 14.0 | 4.6 | |
| 2 | Initial state | 0.65 | 0.57 | 13.2 | 4.9 | 6 |
|   | After deterioration | 0.64 | 0.56 | 12.7 | 4.6 | |
| 3 | Initial state | 0.57 | 0.53 | 16.2 | 4.9 | 4 |
|   | After deterioration | 0.56 | 0.52 | 16.0 | 4.7 | |
| 4 | Initial state | 0.55 | 0.51 | 17.1 | 4.8 | 2 |
|   | After deterioration | 0.54 | 0.50 | 17.4 | 4.7 | |
| 5 | Initial state | 0.86 | 0.62 | 8.8 | 4.7 | 15 |
|   | After deterioration | 0.84 | 0.57 | 8.4 | 4.0 | |
| 6 | Initial state | 0.78 | 0.63 | 10.0 | 4.9 | 10 |
|   | After deterioration | 0.76 | 0.61 | 9.5 | 4.4 | |

Example 7

Following the procedures of Example 1, the remaining gas was purged under vacuum subsequent to the formation of a thin p-type microcrystalline silicon film. An amorphous silicon carbide film was then formed as a p/i interfacial layer to a thickness of 15 nm by charging monosilane, methane, and hydrogen at a ratio of 5/5/12.5 and conducting RF plasma CVD at a pressure of 0.1 Torr, a substrate temperature of 160° C., and an RF power of 0.06 W/cm$^2$. The procedures of Example 1 were then followed to form a substantially intrinsic semiconductor layer and a thin n-type semiconductor film, so that a silicon solar cell was completed.

Photovoltaic characteristics of the solar cell for artificial sunlight having an AM value of 1.5 and an energy density of 100 mW/cm$^2$ were then measured. As a result, the solar cell was found to have an open-circuit voltage $V_{oc}$ of 0.86 V and therefore, had been extremely improved in open-circuit voltage over the conventional art. Its fill factor FF, short-circuit current $I_{sc}$, and photovoltaic efficiency η were 0.60, 10.1 mA/cm$^2$, and 5.2%, respectively. The solar cell therefore showed outstanding characteristics. Further, the solar cell was irradiated at a temperature of 40° C. over 800 hours by light from a halogen lamp having an energy density of 100 mW/cm$^2$. Its post-irradiation photovoltaic characteristics were measured. As a result, the solar cell was found to have an open-circuit voltage $V_{oc}$ of 0.84 V, a fill factor FF of 0.57, a short-circuit current $I_{sc}$ of 10.0 mA/cm$^2$, and a photovoltaic efficiency η of 4.8%. Its deterioration rate of photovoltaic efficiency was hence determined to be 8%. Deterioration was therefore successfully reduced.

Thin films, which were equivalent to the p/i interfacial layer in the silicon solar cell, were formed to a thickness of 500 nm on a quartz substrate and a crystalline silicon substrate, respectively. They were subjected to secondary ion mess spectroscopy and light absorption spectroscopy. The thin films were ascertained to be made of carbon-containing amorphous silicon. They were also found to have a band gap of 2.45 eV.

Example 8

Using a film-depositing system similar to that employed in Example 1, a photovoltaic device of the stacked tandem structure was fabricated with two layers of stacked p-i-n semiconductor structures arranged in series.

After a glass substrate with a translucent electrode made of tin oxide formed on a surface thereof was placed in the loading chamber, the loading chamber was evacuated to a reduced pressure of 1×10$^{-6}$ Torr. The substrate was heated at 160° C. for 30 minutes. The substrate was then transferred to the p-type doped film deposition chamber, where a thin p-type amorphous silicon carbide film was deposited. The formation of the thin p-type amorphous silicon carbide film was conducted by charging, as a feed gas, monosilane, diborane, methane and hydrogen at a ratio of 4/0.06/5/26 and conducting plasma CVD at a pressure of 0.15 Torr, a substrate temperature of 160° C. and an RF power of 0.05 W/cm$^2$. The forming rate of the thin p-type amorphous silicon carbide film was 0.05 nm/sec and the film-forming time was set at 150 sec, so that the thin p-type amorphous silicon carbide film was formed to a thickness of 7.5 nm. The formation of the thin p-type amorphous silicon carbide film was then suspended. After remaining gas was purged under vacuum, an amorphous silicon carbide film was deposited as a p/i interfacial layer to a thickness of 10 nm by charging monosilane, methane, and hydrogen at a ratio of 5/5/12.5 and conducting plasma CVD at a pressure of 0.1 Torr, a substrate temperature of 160° C., and an RF power of 0.06 W/cm$^2$.

The substrate was next transferred to an i-type layer deposition chamber, where a thin amorphous silicon film was formed to a thickness of 250 nm by charging monosilane at a flow rate of 10 cc/min (as measured under standard conditions) and conducting RF plasma CVD at a pressure of 0.05 Torr, a substrate temperature of 160° C., a frequency of 13.56 MHz, and an RF power of 0.1 W/cm$^2$. Subsequent to the formation of the thin i-type semiconductor film, the substrate was transferred to the n-type doped layer forming chamber. A thin n-type semiconductor film was formed to a thickness of 10 nm by charging a feed gas, that is, monosilane, phosphine, and hydrogen at flow rates giving a ratio of 10/0.02/10 and conducting Rf plasma CVD at a pressure of 0.10 Torr, a substrate temperature of 160° C., a frequency of 13.56 MHz, and an RF power of 0.06 W/cm$^2$.

To form a second p-type semiconductor layer, a thin p-type microcrystalline silicon film was additionally formed. The thin p-type microcrystalline silicon film was formed to a thickness of 20 nm by charging, as a feed gas, monosilane, diborane, and hydrogen at a ratio of 1/0.003/100 and conducting RF plasma CVD at a pressure of 0.2 Torr, a substrate temperature of 160° C., a frequency of 13.56 MHz, and an RF power of 0.6 W/cm$^2$. The substrate was next transferred to the i-type layer forming chamber and under the same conditions as those employed upon formation of the substantially intrinsic semiconductor layer in Example 1, a thin microcrystalline film was formed as a second substantially intrinsic semiconductor layer to a thickness of 1,600 nm by RF plasma CVD. At that time, the frequency and RF power were 13.56 MHz and 0.10 W/cm$^2$, respectively. Subsequent to the formation of the second thin substantially intrinsic semiconductor layer, the substrate was transferred to the n-type doped layer deposition chamber. A second thin n-type semiconductor film was formed to a thickness of 40 nm by charging a feed gas, namely, monosilane, phosphine, and hydrogen at flow rates giving a ratio of 0.5/0.06/120 and conducting RF plasma CVD at a pressure of 0.2 Torr, a substrate temperature of 160° C., a frequency of 13.56 MHz, and an RF power of 0.8 W/cm$^2$. Finally, the substrate was taken out of the film-depositing system and a silver electrode was formed by vacuum evaporation, whereby a tandem silicon solar cell was completed.

Photovoltaic characteristics of the solar cell were measured by irradiating artificial sunlight having an AM value of 1.5 and an energy density of 100 mW/cm$^2$ from the solar simulator. As a result, the solar cell was found to have an open-circuit voltage $V_{oc}$ of 1.31 V, a fill factor FF of 0.70, and a short-circuit current $I_{sc}$ of 10.2 mA/cm$^2$. Namely, a high fill factor FF was obtained. As a consequence, the photovoltaic efficiency η was 9.4%, i.e., excellent. Further, the solar cell was irradiated at a temperature of 40° C. over 800 hours by light from a halogen lamp having an energy density of 100 mW/cm$^2$. Its post-irradiation photovoltaic characteristics were measured. As a result, the solar cell was found to have an open-circuit voltage $V_{oc}$ of 1.31 V, a fill factor FF of 0.70, a short-circuit current $I_{sc}$ of 9.8 mA/cm$^2$, and a photovoltaic efficiency η of 9.0%. Its deterioration rate of photovoltaic efficiency was hence determined to be 4%. Deterioration was therefore successfully reduced.

To determine the internal structure of the first thin n-type semiconductor film of the silicon solar cell, a thin n-type semiconductor film was formed to a thickness of 40 nm on a quartz substrate under conditions similar to those employed for formation of the first thin n-type semiconductor film, that is, by charging a feed gas, namely, monosilane, phosphine and hydrogen at flow rates giving a ratio of 10/0.02/10 and conducting Rf plasma CVD at a pressure of 0.10 Torr, a substrate temperature of 160° C., and an RF power of 0.06 W/cm$^2$. A Raman scattering spectrum of the thin n-type semiconductor film was then measured. As a result, only a broad peak corresponding to amorphous silicon was observed centering at 480 cm$^{-1}$. The film was therefore confirmed to be a thin amorphous silicon film.

Example 9

A silicon solar cell was fabricated following the procedures of Example 8 except that only the film-forming conditions for the first thin n-type semiconductor film were changed. In this example, a first thin n-type semiconductor film was formed to a thickness of 40 nm by charging, as a feed gas, monosilane, phosphine, and hydrogen at such flow rates as giving a ratio of 0.5/0.06/120 and conducting RF plasma CVD at a pressure of 0.2 Torr, a substrate temperature of 160° C., and an RF power of 0.8 W/cm$^2$.

Photovoltaic characteristics of the solar cell were measured by irradiating artificial sunlight having an AM value of 1.5 and an energy density of 100 mW/cm$^2$ from the solar simulator. As a result, the solar cell was found to have an open-circuit voltage $V_{oc}$ of 1.32 V, a fill factor FF of 0.73, and a short-circuit current $I_{sc}$ of 10.4 mA/cm$^2$ and a photovoltaic efficiency η of 10.0%. Further, the solar cell was irradiated at a temperature of 40° C. for over 800 hours by light from a halogen lamp having an energy density of 100 mW/cm$^2$. Its post-irradiation photovoltaic characteristics were measured. As a result, the solar cell was found to have an open-circuit voltage $V_{oc}$ of 1.31 V, a fill factor FF of 0.72, a short-circuit current $I_{sc}$ of 9.8 mA/cm$^2$, a photovoltaic efficiency η of 9.2%. Its deterioration rate of photovoltaic efficiency was hence determined to be 8%. Deterioration was therefore successfully reduced.

To determine the internal structure of the first thin n-type semiconductor film of the silicon solar cell, a thin n-type semiconductor film was formed to a thickness of 40 nm on a quartz substrate under conditions similar to those employed during formation of the first thin n-type semiconductor film, that is, by charging a feed gas, namely, monosilane, phosphine, and hydrogen at flow rates giving a ratio of 0.5/0.06/120 and conducting RF plasma CVD at a pressure of 0.2 Torr, a substrate temperature of 160° C., and an RF power of 0.8 W/cm$^2$. A Raman scattering spectrum of the thin n-type semiconductor film was then measured. As a result, there were observed a broad peak centering at 480 cm$^{-1}$ and corresponding to amorphous silicon and a peak centering at 520 cm$^{-1}$ and corresponding to crystalline silicon. The film was therefore confirmed to be a thin microcrystalline silicon film.

Example 10

Following the procedures of Example 9, in a similar manner to Example 2 a silicon solar cell was fabricated with an amorphous silicon carbide film formed as a p/i interfacial layer to a thickness of 15 nm between a second thin p-type semiconductor film and a second substantially intrinsic semiconductor layer.

Photovoltaic characteristics of the solar cell were measured by irradiating artificial sunlight having an AM value of 1.5 and an energy density of 100 mW/cm$^2$ from the solar simulator. As a result, the solar cell was found to have an open-circuit voltage $V_{oc}$ of 1.34 V, a fill factor FF of 0.68, a short-circuit current $I_{sc}$ of 10.2 mA/cm$^2$, and a photovoltaic efficiency η of 9.3%. Further, the solar cell was irradiated at a temperature of 40° C. over 800 hours by light from a halogen lamp having an energy density of 100 mW/cm$^2$. Its post-irradiation photovoltaic characteristics were measured. As a result, the solar cell was found to have an open-circuit voltage $V_{oc}$ of 1.33 V, a fill factor FF of 0.67, and a short-circuit current $I_{sc}$ of 10.1 mA/cm$^2$. Its photovoltaic efficiency η was 9.0%. Its deterioration rate of photovoltaic efficiency was hence determined to be 3%. Deterioration was therefore successfully reduced.

Comparative Examples 1 to 2

In each comparative example, a silicon solar cell was fabricated as in Example 1 except that the film-forming conditions for the deposition of the initial film of the thin microcrystalline silicon film constituting the substantially intrinsic semiconductor layer and those for the subsequent formation of the principal film were changed. Table 4 presents forming conditions for each microcrystalline silicon film constituting a substantially intrinsic semiconductor layer, Table 5 shows characteristics of each initial film and its corresponding principal film measured as single films as in Example 1, and Table 6 summarizes characteristics of each solar cell so obtained.

TABLE 4

Overview of Film-Forming Conditions for i-Type Layers of Silicon Solar Cells Obtained in Comparative Examples

| Comp. Ex. No. | | Substrate temperature °C. | SiH$_4$/H$_2$ cc/min | Deposition pressure Torr | RF power W/cm$^2$ | Film thickness nm |
|---|---|---|---|---|---|---|
| 1 | Initial film | 200 | 15/85 | 0.15 | 0.64 | 1 |
|   | Principal film | 200 | 50/50 | 0.15 | 0.64 | 1000 |
| 2 | Initial film | 300 | 0.1/99.9 | 0.15 | 0.05 | 150 |
|   | Principal film | 300 | 0.1/99.9 | 0.15 | 0.05 | 1000 |

TABLE 5

Overview of Single Film Characteristics of Microcrystalline Silicon Films Obtained in Comparative Examples

| Comp. Ex. No. | | Deposition rate nm/sec | Dark conductivity S/cm | Crystallite size nm | Crystalline fraction % |
|---|---|---|---|---|---|
| 1 | Initial film | 0.2 | 8 × 10$^{-12}$ | <1 | Not determined |
|   | Principal film | 2.3 | Not determined | <2 | <5 |
| 2 | Initial film | 0.008 | 1 × 10$^{-8}$ | 20 | Not determined |
|   | Principal film | 0.0101 | Not determined | 20–1200 | >90 |

TABLE 6

Overview of Characteristics of Silicon Solar
Cells Obtained in Comparative Examples

| Comp. Ex. No. | | Open-circuit voltage V | Fill factor | Short-circuit current mA/cm$^3$ | Photovoltaic efficiency % | Deterioration rate of photovoltaic efficiency % |
|---|---|---|---|---|---|---|
| 1 | Initial state | 0.78 | 0.45 | 9.4 | 3.3 | 27 |
|   | After deterioration | 0.75 | 0.38 | 8.5 | 2.4 | |
| 2 | Initial state | 0.36 | 0.34 | 17.2 | 2.1 | 19 |
|   | After deterioration | 0.33 | 0.33 | 15.6 | 1.7 | |

As is evident from the foregoing examples and comparative examples, use of a thin microcrystalline silicon semiconductor film, which features inclusion of prismatic or conical phases formed by aggregation of crystallites having a crystallite size in the range of from 2 to 1,000 nm, as a thin substantially intrinsic semiconductor layer in a p-i-n solar cell leads to improvements in power characteristics owing especially to an improved open-circuit voltage and also to a significant improvement in light stability over solar cells using materials employed in the conventional art, thereby making it possible to fabricate a solar cell having excellent characteristics. As a consequence, the present invention has brought about a significant practical contribution to an improvement in the photovoltaic efficiency of a silicon solar cell.

What is claimed is:

1. A process for forming a thin microcrystalline silicon semiconductor film comprising an amorphous phase with a crystallite aggregate phase contained therein on a substrate by RF plasma CVD while using as a raw material at least a compound having silicon in the molecule thereof, which comprises:

first forming an initial film of said thin microcrystalline silicon semiconductor film to a thickness in a range of from 2 nm to 100 nm on said substrate and then forming a principal film of said thin microcrystalline silicon semiconductor film, wherein the deposition rate of said initial film is in a range of from 0.01 nm/sec to 0.1 nm/sec and the deposition rate of said principal film is greater than the deposition rate of said initial film and is in a range of from 0.1 nm/sec to 2 nm/sec.

2. A process for forming a thin microcrystalline silicon semiconductor film comprising an amorphous phase with a crystallite aggregate phase contained therein composed of crystallites aggregated in a prismatic or conical form on a substrate by RF plasma CVD while using as a raw material at least a compound having silicon in the molecule thereof, which comprises:

first forming an initial film of said thin microcrystalline silicon semiconductor film to a thickness in a range of from 2 nm to 100 nm on said substrate and then forming a principal film of said thin microcrystalline silicon semiconductor film, wherein the deposition rate of said initial film is in a range of from 0.01 nm/sec to 0.1 nm/sec and the deposition rate of said principal film is greater than the deposition rate of said initial film and is in a range of from 0.1 nm/sec to 2 nm/sec.

3. A process according to claim 2, wherein said compound having silicon in the molecule thereof is used in a form diluted with hydrogen and the concentration of said compound after dilution is at least 0.01% by volume.

4. A process according to claim 2, wherein said thin microcrystalline silicon semiconductor film is a thin substantially intrinsic semiconductor film.

5. A process for forming a thin microcrystalline silicon semiconductor film comprising an amorphous phase with crystallites contained therein, a portion of said crystallites being dispersed as single crystallites and the remaining portion of said crystallites being in the from of a prismatic or conical crystallite aggregate phase, said film being formed on a substrate by RF plasma CVD while using as a raw material at least a compound having silicon in the molecule thereof, said process comprising:

first forming an initial film of said thin microcrystalline silicon semiconductor film to a thickness in a range of from 2 nm to 100 nm on said substrate and then forming a principal film of said thin microcrystalline silicon semiconductor film, wherein the deposition rate of said initial film is in a range of from 0.01 nm/sec to 0.1 nm/sec and the deposition rate of said principal film is greater than the deposition rate of said initial film and is in a range of from 0.1 nm/sec to 2 nm/sec.

6. A process according to claim 5, wherein said compound having silicon in the molecule thereof is used in a form diluted with hydrogen and the concentration of said compound after the dilution is at least 0.01% by volume.

7. A process according to claim 5, wherein said thin microcrystalline silicon semiconductor film is a thin substantially intrinsic semiconductor film.

* * * * *